United States Patent
Nunez Bootello et al.

(10) Patent No.: US 8,937,983 B2
(45) Date of Patent: Jan. 20, 2015

(54) DEVICE FOR TRANSFORMATION OF CONCENTRATED SOLAR ENERGY

(75) Inventors: Juan Pablo Nunez Bootello, Seville (ES); Manuel Gallas Torreira, Seville (ES)

(73) Assignee: Abengoa Solar New Technologies, S.A., Serville (ES)

(*) Notice: Subject to any disclaimer, the term of this patent is extended or adjusted under 35 U.S.C. 154(b) by 0 days.

(21) Appl. No.: 14/130,583

(22) PCT Filed: Jun. 28, 2012

(86) PCT No.: PCT/ES2012/070478
§ 371 (c)(1), (2), (4) Date: Feb. 10, 2014

(87) PCT Pub. No.: WO2013/004868
PCT Pub. Date: Jan. 10, 2013

(65) Prior Publication Data
US 2014/0153604 A1    Jun. 5, 2014

(30) Foreign Application Priority Data
Jul. 5, 2011 (ES) .................................. 201131140

(51) Int. Cl.
*H01S 5/00* (2006.01)
*H01S 5/026* (2006.01)
(Continued)

(52) U.S. Cl.
CPC ............. *H01S 5/026* (2013.01); *H01S 3/06741* (2013.01); *H01S 3/0915* (2013.01);
(Continued)

(58) Field of Classification Search
CPC ... H01S 3/06741; H01S 3/0915; H01S 5/026; H01S 3/06704; H01S 3/08059; H01S 3/23; H01S 3/005; H01L 31/0522; H01L 31/0525; H01L 31/055; G02B 6/02314; Y02E 10/52

USPC .............. 372/6, 50.1, 68, 71, 89, 98, 99, 108
See application file for complete search history.

(56) References Cited

U.S. PATENT DOCUMENTS

| | | |
|---|---|---|
| 4,001,704 A | 1/1977 | Danielmeyer et al. |
| 5,285,465 A | 2/1994 | Schilling et al. |

(Continued)

FOREIGN PATENT DOCUMENTS

| | | |
|---|---|---|
| CN | 201018430 Y | 2/2008 |
| CN | 101237196 A | 8/2008 |

(Continued)

OTHER PUBLICATIONS

International Preliminary Report on Patentability issued Jan. 5, 2014, in PCT/ES2012/070478, filed Jun. 28, 2012.

(Continued)

*Primary Examiner* — Yuanda Zhang
(74) *Attorney, Agent, or Firm* — Oblon, Spivak, McClelland, Maier & Neustadt, L.L.P.

(57) ABSTRACT

A device for transformation of concentrated solar energy including a photovoltaic cell and laser device, which includes a first reflecting mirror adapted for entry of a beam of solar rays and a second reflecting mirror adapted for an outlet of a laser beam, with the first reflecting mirror reflective on an outlet wavelength of the laser beam and transparent to a totality of a solar spectrum and the second reflecting mirror partially reflective on the wavelength of the laser beam, reflective in an interval of the solar spectrum which is absorbed and transparent in other wavelengths different to these, and at the outlet of the laser beam. The device includes a nucleus doped with substances for total or partial absorption of the solar spectrum and coatings.

15 Claims, 3 Drawing Sheets

(51) Int. Cl.
    *H01S 3/067* (2006.01)
    *H01S 3/0915* (2006.01)
    *H01L 31/052* (2014.01)
    *H01L 31/055* (2014.01)
    *H01S 3/08* (2006.01)
    *H01S 3/23* (2006.01)
    *H01S 3/00* (2006.01)
    *G02B 6/02* (2006.01)

(52) U.S. Cl.
    CPC .......... H01L31/0525 (2013.01); H01L 31/055 (2013.01); H01L 31/0522 (2013.01); *H01S 3/06704* (2013.01); *H01S 3/08059* (2013.01); *H01S 3/23* (2013.01); *H01S 3/005* (2013.01); *G02B 6/02314* (2013.01); *Y02E 10/52* (2013.01)
    USPC .................. 372/50.1; 372/6; 372/68; 372/71; 372/89; 372/98; 372/99; 372/108

(56) References Cited

U.S. PATENT DOCUMENTS

| | | |
|---|---|---|
| 6,717,971 B2 | 4/2004 | Marsh et al. |
| 2002/0097762 A1 | 7/2002 | Marsh et al. |
| 2008/0158864 A1 | 7/2008 | Lai et al. |
| 2008/0225912 A1* | 9/2008 | Yabe et al. ................ 372/35 |
| 2011/0110389 A1* | 5/2011 | Yoshida et al. ........... 372/35 |

FOREIGN PATENT DOCUMENTS

| | | |
|---|---|---|
| ES | 2 096 109 T3 | 3/1997 |
| ES | 2 236 499 T3 | 7/2005 |
| GB | 2 445 193 A | 7/2008 |
| JP | 2005-39162 A | 2/2005 |

OTHER PUBLICATIONS

International Search Report and Written Opinion issued Oct. 17, 2012, in PCT/ES2012/070478 with English translation of International Search Report, filed Jun. 28, 2012.

Tese of EdisonTripole2004, Documento retrieved from internet, "Potencial of utilizaçao of fibras ópticas no desenvolvimento of concentradores solares",Oct. 2, 2005;,<URL: http://www.ufv.br/dea/ambiagro/arquivos/> , 83 pages with English Abstract.

Dawei Liang, et al., "A Simple Approach for Enhancing the Output Performance of Solar-Pumped Solid-State Lasers", International Journal of Optics, vol. 2009, Article ID 730165, (2009) <URL:http://www.hindawi.com/journals/ijo/2009/730165/> , 8 pages.

* cited by examiner

A-A

DEVICE FOR TRANSFORMATION OF CONCENTRATED SOLAR ENERGY

PURPOSE OF THE INVENTION

The object of the invention is a device for transforming concentrated solar energy, provided with a series of technical characteristics designed to ensure increased efficiency and reduce the overall costs of transforming solar energy to electricity in a solar plant, optimising the overall use made of the solar spectrum.

BACKGROUND OF THE INVENTION

Capturing and concentrating solar energy is a well-researched subject, which has been developed and applied in the state of the art. The current challenges facing solar plants include maximising the $C/C_{max}$ ratio of the concentrator collectors, where C is the concentration and $C_{max}$ the maximum theoretical technical concentration, reducing geometric losses due to the so-called cosine effect, as a result of shade and obstacles between trackers, reducing optical and thermal losses and reducing installation costs to levels which will make the technology competitive in respect of other energy sources.

Maximising concentration enables thermal losses to be reduced at the plant, reducing the costs of receiver devices, typically thermosolar and photovoltaic types, in addition to increasing typical working temperatures of the heat transferring fluids or the reactors in order to obtain solar fuels.

Another considerable challenge facing the industry is the transformation of solar energy into electricity. There are two main methods employed in the state of the art in order to achieve this, namely, photovoltaic and thermosolar technologies.

Photovoltaic technology is continuously developing, and has sufficient potential for improvement to be capable of surpassing thermoelectric plants in terms of efficiency, due to the future use of advanced materials. However, it has the disadvantage of not being manageable and that there is a wavelength range above which photovoltaic cells are unable to convert all the energy from the photons into electrical power, and below which the excess energy transported by the photon is lost in the form of heat.

Thermosolar technology does not have the drawbacks of photovoltaic energy, however it presents other problems. Currently there are plans to improve tower type central receiver plants in the midterm, with respect to cost and efficiency compared to the other commercial technologies in the large scale electricity power plant market. Nevertheless, central receiver plants have high cosine effects (effect of reduction in the reflective surface area, which causes the incident beams to form a specific angle with the normal angle to the surface) overflows in the receiver, losses through transmission and other phenomena which make it less efficient when compared to the potential of photovoltaic technology. In terms of distributed generation, or market of dozens of kW, Stirling discs are a promising yet still expensive development solution. One of the issues which makes this technology so expensive is the fact of having to support a heavy cantilevered engine in the concentrator focus.

Thermosolar technology has the advantage of thermal inertia and the possibility of storing transformed energy along with the possibility of hybridisation.

The limitations of thermosolar plants can be offset by using light guides to transport concentrated light. It is known in the art that light guides permit numerical openings that is, the range of angles for which the guide accepts light, are very high, the disadvantage is that that they are manufactured using materials which are unable to transmit all the spectral width of the sun, leading to losses, thus this technology is not viable. The solar spectrum window which can be guided without losses ranges from 1250 nm to a limit exceeding 1650 nm presenting losses of 0.2 dB/km at around 1550 nm.

Solar lasers which partially transform the incident spectrum of solar light into a laser beam are also known in the art. This type of solar laser consists of the following:

An optical cavity, also known as resonator or oscillator, consisting of two reflective mirrors between which the laser light is trapped as it is alternatively reflected in both;

A doped active medium situated between both reflecting mirrors, which may be solid, liquid or gaseous, the function of which is to amplify a range of wavelengths and specific modes so that the photons suffer multiple reflections within the cavity and pass through it;

A source of solar light, able to generate population inversion in the active medium, that is, light able to ensure that in said medium there are more atoms in an excited state or of the highest quantum mechanical energy, which will enable the greater part of the system atoms to emit light in what is known as stimulated conditions.

Both the resonator and the active medium of the solar laser are preferably cylindrical and the reflecting mirrors are situated at their ends. Solar lasers are normally illuminated laterally by concentrated solar light using CPC or Compound Parabolic Concentrator type concentrators. The first reflecting mirror of the cavity is adapted to be highly reflective only in the area of the laser outlet length and its surroundings. The second mirror, that is, that of the laser outlet partially reflects incident laser light and transmits the fraction which is not reflected, this transmitted light is in itself the laser light that generates the device. In this way photons are trapped in the resonator moving from one mirror to another and amplified by the active medium.

If the amplification is high enough to overcome losses, a phenomenon commonly known as threshold condition, a single photon may be amplified by various orders of magnitude, thus producing a considerable number of coherent photons trapped within the resonator. If the photons come and go between the mirrors for a sufficiently long period of time, the laser will achieve a permanent regime and a constant power will circulate between the mirrors. The solar laser may therefore transform part of the entering solar spectrum into an outgoing laser beam at a specific wave length. The active medium material has an absorption spectrum which does not necessarily need to coincide with its emission spectrum.

Solar energy may be pumped to the laser either through the lateral face or longitudinally, that is, through one of its ends, so that the light is injected in the direction of the laser beam generated.

PCF (Photonic Crystal Fibre) guides are also known in the state of the art and are a type of optic fibre based on the properties of photonic crystals and they normally have a nucleus and a coating with a different refraction index so that light may be transported considerable distances through them, either through a single mode nucleus or in the interior of the nucleus-coating interface due to the total internal reflection mechanism based on the light guide, caused by a difference in the refraction index between the two media.

DESCRIPTION OF THE INVENTION

According to the foregoing, the device for transforming concentrated solar energy which is the object of this invention comprises:

An active medium for total or partial absorption of the solar spectrum and for formation of a laser beam. The combination of collection material-doping substance will preferably be selected in such a way that the laser device will absorb an interval of the defined solar spectrum and will issue laser light in a wavelength also defined as greater or less than the incident range.

A first reflecting mirror adapted for entry of the concentrated incident light beam and a second reflecting mirror adapted for outlet of a laser beam. Where the first reflecting mirror is reflective on the outlet wavelength of the laser beam and the second reflecting mirror is partially reflective on the outlet wavelength of the laser beam (10).

The active medium is therefore located between the first and the second reflecting mirrors which are situated facing each other. In this way the laser beam is trapped in the resonator, moving from one mirror to another and is amplified by the active medium. The fraction of laser light issues from the laser device which the outlet mirror allows to escape, based on its transmissibility on the outlet wavelength of the laser beam. The wavelength photons allowed by the resonator will commence a process of reflection and amplification through both mirrors, passing through the active medium and, as previously described, generating a laser beam at the outlet of the device.

The object of the invention is characterised in that the laser device additionally comprises a photovoltaic cell in series with the laser device, with the first reflecting laser, that is, the entry mirror, transparent to all the wavelengths of the solar spectrum and the second reflecting mirror or outlet mirror reflective in the interval of absorption wavelengths of the active medium and transparent in the other different wavelengths and that of the laser beam outlet, and furthermore, where the laser device comprises:

A doped nucleus as an active medium. The combination of collection material-donating substance shall preferably be selected in such a way that the laser will absorb an interval of the solar spectrum defined, and will emit a laser beam situated longitudinally with respect to the laser beam.

A first nucleus coating which has a refraction index lower than the nucleus refraction index so that the laser beam generated is transmissible within the first coating-nucleus interface in single mode.

A second coating of the refraction index lower than that of the first coating so that the concentrated incident solar beam is transmissible within the first second coating interface by means of the total internal reflection mechanism.

In this way it is possible for the solar energy transformation device to feed a PCF fibre so that, in the event that the laser device fails to absorb all the solar spectrum, the non-absorbed part will be transmitted to the PCF fibre due to the total internal reflection in the interface between the coatings, where it will continue to be transmitted by means of the same internal total reflection phenomenon. The PCF fibre will have a numerical aperture similar to that of the laser and the same entry opening geometry.

In this way, concentrated solar radiation, in multimode, is able to pass through a photovoltaic cell which absorbs part of the solar spectrum, within the high efficiency window of a photovoltaic cell, producing electricity power. It also passes through the laser device described above which transforms part of the incident spectrum in single mode to the light guide transmission window in one or several steps, and finally all the concentrated solar light in multimode which has not been absorbed by the photovoltaic cell or transformed by the laser beam may pass to a light guide through total internal reflection. The electrical power produced by the photovoltaic cell may be used to cover own consumption associated with possible cooling of the laser device and/or the light guide or may be inserted in the network in the event of excess production.

Therefore, the following advantages are obtained with the configuration described above:

Transformation of part of the solar spectrum of concentrated solar light into coherent light with a frequency that is able to enter the window of transmissibility of the phototonic crystal fibre light guides, therefore making it possible to transfer through the same without losses over long distances to devices able to generate electricity based on solar energy;

Transformation of part of the concentrated solar light spectrum into coherent light with a frequency such that it would enter the high efficiency window of a photovoltaic cell; and Permit the rest of the untransformed solar spectrum to pass through and which would be transmitted by total internal reflection through the light guide.

In this way the device which is the object of the invention permits makes efficient use of the whole solar spectrum, generating greater efficiency than current solar plants and at a lower cost, while obtaining manageable energy through transformation of a part or all of the solar spectrum.

DESCRIPTION OF THE DRAWINGS

In order to complement this description and ensure a greater understanding of the characteristics of the invention, in accordance with a preferred example of the practical embodiment thereof, a set of drawings is included which illustrate the invention without being exhaustive examples, and which represent the following.

PREFERRED EMBODIMENT OF THE INVENTION

Figure 1:
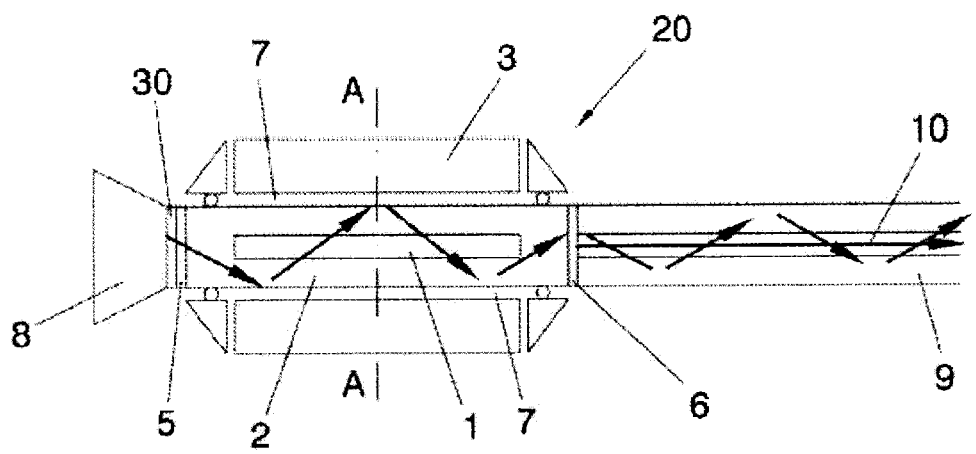
FIG. 1-. Shows a longitudinal diagram of a device for transforming solar energy according to an example of an embodiment of the invention.
Figure 2:
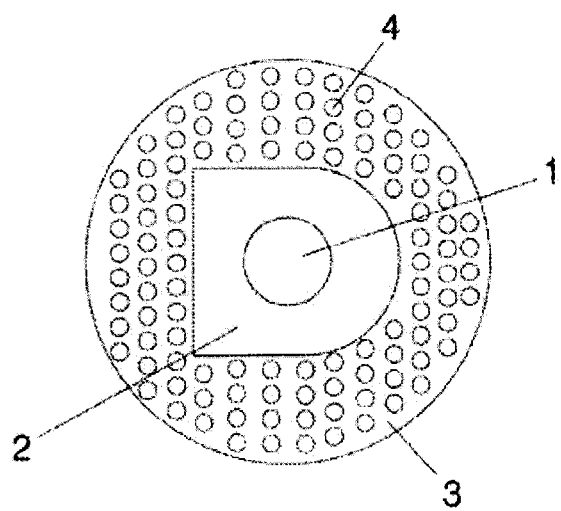
FIG. 2-. Shows a diagram of a cross section of an example of an embodiment of the laser device corresponding to FIG. 1.

FIG. 1 shows an example of an embodiment of a device for transformation of solar energy which is the object of this invention. It comprises a photovoltaic cell (30) supplied by a concentrated incident light beam (8) followed by a laser device (20) situated in series which includes a first reflecting mirror (5) and a second reflecting mirror (6). The laser device (20) comprises the doped nucleus (1), which is the active medium, an initial coating (2) which has a refraction index that differs from the nucleus refraction index (1), being specifically lower. It also has a second coating (3), so that the nucleus (1) has a double coating (2, 3).

The nucleus (1) will preferably be doped with rare earth elements and transition metals.

The laser device (20) supplies a PCF fibre (9). It may also be provided with a water pipe (7) located between the first coating (2) and the second coating (3) for cooling the laser device (20).

The laser device (20) is pumped through the end, which has the advantage in solar applications of allowing connection of various solar collection and concentration devices and/or photovoltaic cells (30), thus ensuring an extremely high quality of the laser beam (10).

Preferentially, the length of the laser device (20) shall be sufficiently high to ensure that the solar light pumping spectrum selected is completely absorbed by the nucleus (1), as a maximum, in one return trip. Furthermore, the design trend of the laser dispositive (20) will be to maximise the diameter of the resonator and the cylindrical bar of the nucleus (1).

The first coating (2) is provided with a non-circular section in order to increase the number of times that the rays reflected in the first coating (2)—second coating (3) interface pass through the doped nucleus (1). The first coating (2) may also be doped.

In the example of an embodiment shown in the Figures, the second coating (3) comprises longitudinal pipes (4) through which air could circulate in order to cool the laser device (20). It also has a cylindrical section.

More specifically, the refraction index of the first coating (2) is a refraction index close to that of the nucleus (1) which may be 1.6, for example, whereas the second coating (3) has a refraction index close to 1.2 that is, less than that of the nucleus (1). In this way solar rays concentrated in multimode may travel through total internal reflection within the first-second coating interface (2, 3).

Figure 4:
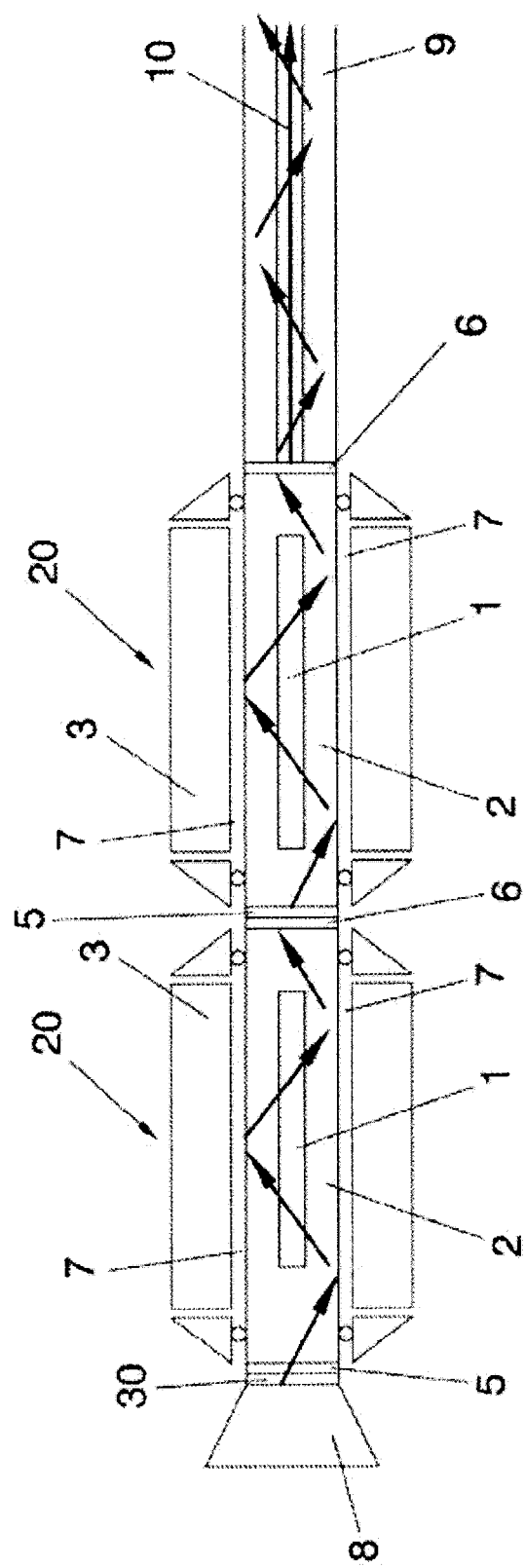
FIG. 4-. Shows a diagram of a longitudinal view of a second example of an embodiment of the device for transforming solar energy, which includes a plurality of laser devices according to an example of an embodiment corresponding to FIG. 1.

FIGS. 1 and 4 show the photovoltaic cell (30) situated in front of the laser device (20). Furthermore, the photovoltaic cell (30) generates electricity power which supplies the laser device (20) in order to cover its consumption and possibly even cover other types of power consumption, as mentioned previously.

FIG. 3 shows various examples of an embodiment of the doped nucleus (1) in which the nucleus (1) is partially doped, thus avoiding any cracking due to different thermoelastic tensions.

Figure 3A:
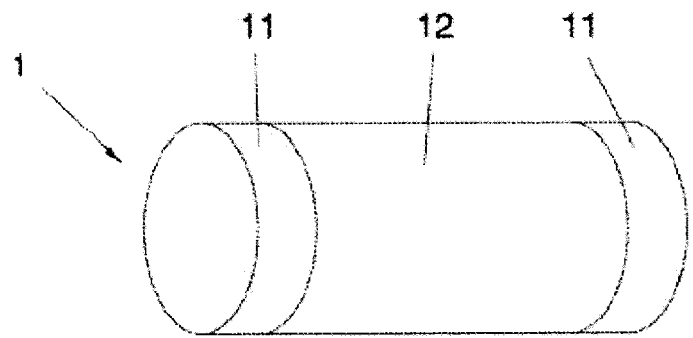
FIG. 3A-. Shows a longitudinal view of a first example of an embodiment of the nucleus.

FIG. 3A shows the laser nucleus (1) which comprises a central doped section (12) and non-doped end sections (11), thus reducing maximum temperatures, the tendency of thermal cracking, and thermal stress.

Figure 3B:
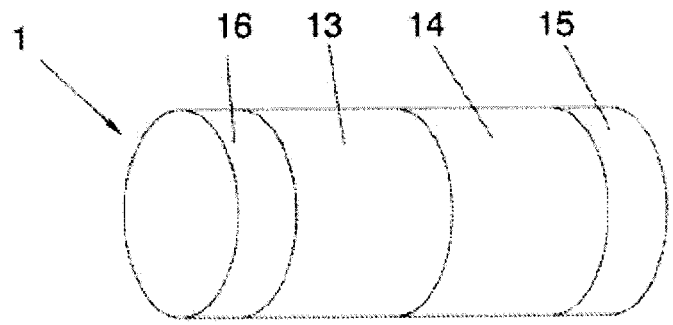
FIG. 3B-. Shows a longitudinal view of a second example of an embodiment of the nucleus.

FIG. 3B shows the nucleus (1) comprising various longitudinal sections with a different doping index (13, 14, 15, 16) thus enabling a more uniform temperature to be maintained.

Figure 3C:
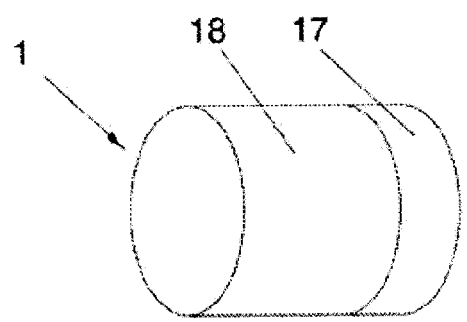
FIG. 3C-. Shows a diagram of a longitudinal view of a third example of an embodiment of the nucleus.

FIG. 3C shows the nucleus (1) comprising a first non-doped section (18) followed by a second doped section (17).

FIG. 4 shows a second example of an embodiment in which the transformation from the solar spectrum to a frequency within the transmission window of the light guide (9) is made in several stages with various laser devices (20) in series.

This last embodiment makes it possible to pass from a range of wavelengths from the solar spectrum, to a preferable length of laser beams in various stages, thus using different combinations of doping—source material for different nuclei (1) of the laser devices (20) in series, such as, for example, a laser device (20) of the Nd:YAG type which absorbs between 780 and 900 nm which makes it possible to pass to 1064 nm, followed by a Yb:YAG type laser (20) which absorbs from 900 nm to 1000 nm, thus passing to a wavelength of 1030 nm, followed by a Cr4+:MgSiO4 type laser device (20) also in series, which permits passing to wavelengths of 1100 nm to 1370 nm. The remaining wavelengths which are not absorbed by the laser devices (20) travel through total internal reflection, as mentioned previously.

In addition to the foregoing, another configuration is possible which incorporates various photovoltaic cells (30) in the middle, and with conversions of both high and low wavelength in order to regulate the range which passes to the photovoltaic cell (30) and the light guide (9).

The invention claimed is:

1. A device for transformation of concentrated solar energy, comprising:
   a laser device comprising:
      an active medium for total or partial absorption of solar spectrum and for formation of a laser beam;
      a first reflecting mirror adapted for entry of a concentrated incident light beam;
      a second reflecting mirror adapted for an outlet of the laser beam, which is reflective in an interval of absorption wavelengths of the active medium and transparent in wavelengths different to the interval of absorption wavelength and at the outlet of the laser beam;
      an initial coating of a nucleus which has a refraction index lower than that of the nucleus so that the laser beam generated is transmissible within an interface of the nucleus and the initial coating in single mode; and
      a second coating;
      wherein with the first reflecting mirror is reflective on the outlet wavelength of the laser beam and the second reflecting mirror is partially reflective on the outlet wavelength of the laser beam;
   wherein the active medium is located between the first and the second reflecting mirrors which are arranged facing each other;
   wherein the active medium is a nucleus that includes at least one section with substances configured, totally or partially, to absorb the solar spectrum and generate the laser beam and the active medium is situated longitudinally with respect to the laser device,
   wherein the first reflecting mirror is transparent to all wavelengths of the solar spectrum,
   wherein the second coating has a refraction index lower than the first coating such that the concentrated incident light beam is transmissible within an interface of the first and second coatings by total internal reflection, and
   the solar energy transformation device further comprising a photovoltaic cell in series with the laser device and that is situated before the laser device.

2. The device for transformation of concentrated solar energy, according to claim 1, wherein the laser device is adapted to supply a PCF fiber.

3. The device for transformation of concentrated solar energy, according to claim 1, wherein the laser device further comprises a water pipe located between the first and the second coatings for cooling the laser device.

4. The device for transformation of concentrated solar energy, according to claim 1, wherein a section of the first coating is not circular.

5. The device for transformation of concentrated solar energy, according to claim 4, wherein the section of the first coating is asymmetric.

6. The device for transformation of concentrated solar energy, according to claim 1, wherein the second coating comprises longitudinal pipes for air circulation.

7. The device for transformation of concentrated solar energy, according to claim 1, wherein the second coating comprises a circular section.

8. The device for transformation of concentrated solar energy, according to claim 1, wherein the first coating is doped.

9. The device for transformation of concentrated solar energy, according to claim 1, wherein the nucleus comprises a doped central longitudinal section and non-doped longitudinal end sections.

10. The device for transformation of concentrated solar energy, according to claim 1, wherein the nucleus comprises different longitudinal sections with different dopings.

11. The device for transformation of concentrated solar energy, according to claim 1, wherein the nucleus comprises a first non-doped longitudinal section, followed by a second doped longitudinal section.

12. The device for transformation of concentrated solar energy, according to claim 1, wherein the photovoltaic cell generates electricity power that supplies the laser device to cover its consumption.

13. The device for transformation of concentrated solar energy, according to claim 1, comprising at least two photovoltaic cells situated in series.

14. The device for transformation of concentrated solar energy, according to claim 1, comprising at least two laser devices situated in series with nuclei with wavelength absorption differing from that of the solar spectrum.

15. The device for transformation of concentrated solar energy, according to claim 14, comprising a laser device with Nd:YAG nucleus in series with a laser device having a Yb:YAG nucleus in series with a laser device with a Cr4+:MgSiO4 nucleus.

* * * * *